(12) United States Patent
Hsu et al.

(10) Patent No.: US 6,396,090 B1
(45) Date of Patent: May 28, 2002

(54) TRENCH MOS DEVICE AND TERMINATION STRUCTURE

(75) Inventors: Chih-Wei Hsu, Hsinchu; Chung-Min Liu, Kaohsiung; Ming-Che Kao, Tainan; Ming-Jinn Tsai, Hsinchu; Pu-Ju Kung, Taipei, all of (TW)

(73) Assignees: Industrial Technology Research Institute, Hsinchu; General Semiconductor of Taiwan, Ltd., Taipei, both of (TW)

( * ) Notice: Subject to any disclaimer, the term of this patent is extended or adjusted under 35 U.S.C. 154(b) by 0 days.

(21) Appl. No.: 09/668,663

(22) Filed: Sep. 22, 2000

(51) Int. Cl.[7] ................................................ H01L 29/74
(52) U.S. Cl. .................. 257/242; 257/244; 257/513; 257/520; 257/397; 257/332; 257/329; 257/510
(58) Field of Search .................. 257/242–244, 257/513, 520, 397, 332, 329, 510

(56) References Cited

U.S. PATENT DOCUMENTS 5,929,482 A * 7/1999 Kawakami et al.
6,020,600 A * 2/2000 Miyajima et al.
6,180,966 B1 * 1/2002 Kohno et al.

* cited by examiner

*Primary Examiner*—Fetsum Abraham
(74) *Attorney, Agent, or Firm*—Blakely Sokoloff Taylor & Zafman, LLP

(57) ABSTRACT

A termination structure for power trench MOS devices is disclosed. The MOS devices can be Schottky diode, IGBT or DMOS depending on what kinds of the semiconductor substrate are prepared. The termination structure comprises: a semiconductor substrate having a trench formed therein; a spacer-like MOS gate formed on a sidewall of the trench; a termination structure oxide layer formed in the trench to cover a portion of the spacer-like MOS gate and to cover a bottom of the trench; and a first electrode and a second electrode are, respectively, formed on a bottom surface and upper surface of the semiconductor substrate. The trench is formed from a boundary of the active region to an edge of the semiconductor substrate. The trench MOS devices are formed in the active region. In addition for IGBT and DMOS, the second electrode is isolated from MOS gate by an oxide layer; however, for Schottky diode, the second electrode is directed contact to the MOS gate.

17 Claims, 6 Drawing Sheets

TRENCH MOS DEVICE AND TERMINATION STRUCTURE

FIELD OF THE INVENTION

The present invention is related to a semiconductor device, specifically, to a novel termination structure for trench MOS devices so as to prevent leakage current.

BACKGROUND OF THE INVENTION

Doubled diffused metal-oxide-semiconductor field effect transistor (DMOSFET), insulated gate bipolar transistor (IGBT), and Schottky diode are important power devices and use extensively as output rectifiers in switching-mode power supplies and in other high-speed power switching applications. For example, the applications include motor drives, switching of communication device, industry automation and electronic automation. The power devices are usually required carrying large forward current, high reverse-biased blocking voltage, such as above 30 volt, and minimizing the reverse-biased leakage current. There are several reports that trench DMOS, trench IGBT and trench Schottky diode are superior to those of with planar structure.

For power transistors are concerned, apart from the device in the active region for carrying large current, there is still required a termination structure design in the periphery of the active region usually at an edge of a die so as to prevent voltage breakdown phenomena from premature. Conventional termination structures include local oxidation of silicon (LOCOS), field plate, guard ring, or the combination thereof. The LOCOS is generally known to have bird beak characteristic. In the bird beak, electric field crowding phenomena is readily to occur, which is due to high impact ionization rate. As a result, leakage current is increased and electrical properties of the active region are deteriorated.

For example, please refer to FIG. 1, a semiconductor substrate with trench MOS structure for Schottky diodes, and a trench termination structure formed therein. The substrate is a heavily doped n+ substrate 10 and an epitaxial layer 20 formed thereon. A plurality of trench MOS 15 formed in the epitaxial layer 20. The trench MOS devices including epitaxial layer 20/gate oxide layer 25/polysilicon layer 30 are formed in the active region 5. The boundary of the active region 5 to the edge of the die is a LOCOS region of about 6000 Å in thick formed by conventional method.

For the purpose of lessening the electric field crowding issue, a p+-doping region 50 beneath LOCOS region is formed through ion implantation. The p+-doping region 50 is as a guard ring for reverse-biased blocking voltage enhancement. The anode (a metal layer) 55 is formed on the active region 5 and extends over p+ doping region 50 of LOCOS region. The object is to make the bending region of the depletion boundary far away from the active region 5. Although guard ring 50 can alleviate the electrical field crowding and relax the bending magnitude occurred near the active region, the adjacent region between p+ region 50 and beneath the bottom of the trench MOS device, as arrow indicated denoted by 60, is not a smooth curve. It will increase the leakage current and decrease the reverse-biased blocking capability. A similar situation occurred for field plate combines with guard ring. Furthermore, aforementioned prior art demanded more photo masks (at least four) to fabricate, and the processes are rather complicated. Still high cost for forming such structure is another inferior.

As forgoing several conventional termination structures can not solve the problems thoroughly. An object of the present invention thus proposes a novel termination structure. The new termination structure made the bending region of the depletion region far away from the active region, and depletion boundary is flatter than forgoing prior art. The manufacturing method provided by the present invention is even simpler than those prior arts. Since the termination structure and trench are formed simultaneously, it requires only three photo masks, low complicated processes and low cost.

SUMMARY OF THE INVENTION

The present invention discloses a novel termination structure, which can be formed with trench MOS devices simultaneously. The MOS devices can be Schottky diode, DMOS or IGBT depending on what kinds of the semiconductor substrate are prepared. The termination structure and trench MOS devices comprising: a semiconductor substrate having a plurality of first trenches spaced each other and formed in an active region and having a second trench formed from a boundary of the active region to an edge of the semiconductor substrate; a first-type MOS gate formed in each of the first trenches, and a second MOS gate formed on a sidewall of the second trench; a termination structure oxide layer formed in the second trench to cover a portion of the spacer-like MOS gate and to cover a bottom of the second trench; and a first electrode and a second electrode are, respectively, formed on a bottom surface and upper surface of the semiconductor substrate. The second electrode is located to cover the region from the active region through the spacer-like MOS gate and extended to a portion of the termination structure oxide layer so that a bending portion of the depletion region are distant from the active region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

As depicted in the forgoing background of the invention, the conventional termination structure including local oxidation, electric field plate, guard ring, or the combination thereof, all of them do not solve completely the electric field crowding issues. The field crowding may still occur at different positions, depending on the design difference. The present invention proposes a novel trench termination structure and a method to make them. The novel trench termination structure is to overcome problems of electric field crowding issues. The newly trench termination provides a flat depletion boundary, and the bending region thereof is far away from the active region while encountered a reverse-bias voltage. Consequently, the novel termination structure can prevent breakdown phenomena from being occurred prematurely.

Moreover, the newly termination structure can be applied to any power transistors such as Schottky rectifier, DMOS, IGBT etc. The most important fact is the trench MOS devices can be formed with the trench termination structure simultaneously.

Several exemplified embodiments will be successively illustrated.

The first preferred embodiment is to illustrate the method of forming trench termination structure and the Schottky diode simultaneously.

Figure 1:
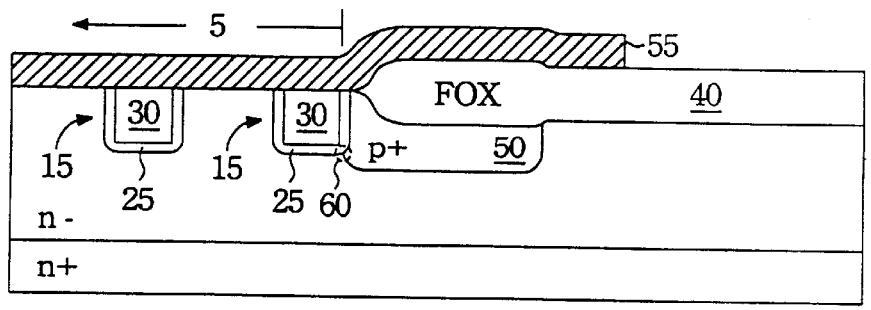
FIG. 1 is a conventional trench Schottky diode devices and LOCOS plus guard ring as a termination structure.
Figure 2:
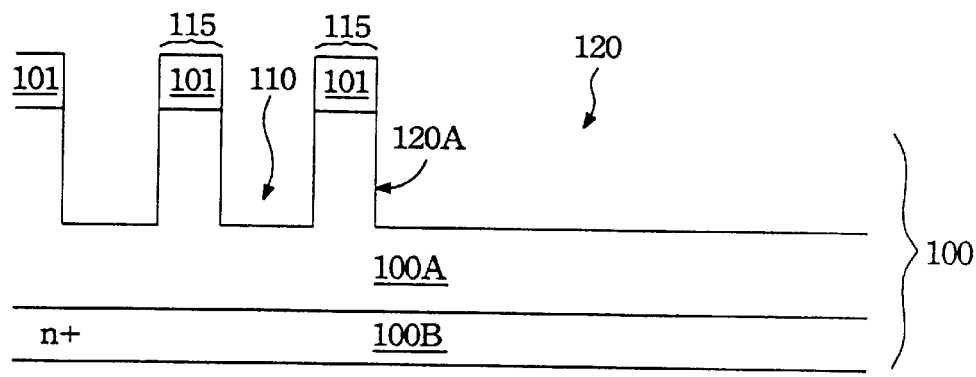
FIG. 2 is a cross-sectional view of forming first trenches and second trench in a semiconductor substrate in accordance with the present invention.

Please refer to FIG. 2, a cross-sectional view shows a semiconductor substrate 100 comprised a first layer 100A having a first kind of conductive impurity doped (for example type n) and a base substrate 100B having a first kind of conductive impurity heavily doped (for example n+). First layer 100A is formed epitaxially on the base substrate 100B for forming Schottky contact and the base substrate is for forming ohmic contact while metal layers are formed thereon.

An oxide layer 101 is then formed on the first substrate 100A by CVD to about 2000 Å–10000 Å. Next, a photoresist (not shown) is coated on the oxide layer 101 to define a plurality of first trenches 110 and a second trench 120. Each of the first trenches 110 is about 0.2–2.0 μm in width from cross-sectional view formed in the active region. The second trench 120 is spaced by a mesa 115 to the first trench 110 and formed from the boundary of the active region to an edge of a semiconductor substrate 100 (or a die). The second trench 120 is to make depletion boundary flat and prevent electric field crowding.

Figure 3:
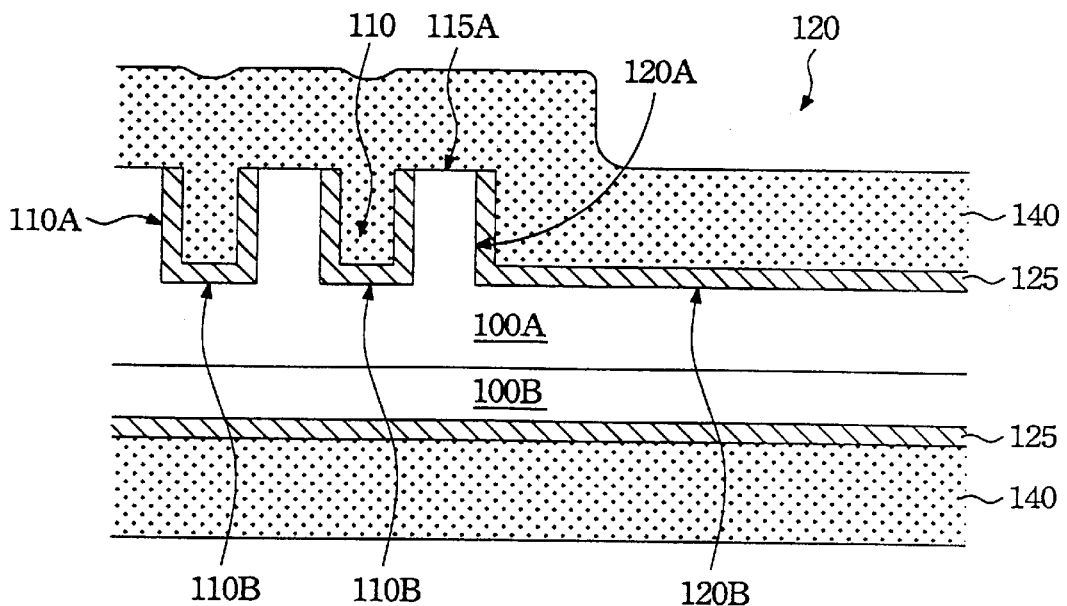
FIG. 3 is a cross-sectional view of refilling the first trenches and the second trench with a first conductive material in accordance with the present invention.

Referring to FIG. 3, after oxide layer 101 removal, a high temperature oxidation process to form gate oxide layer 125 is performed. The gate oxide layer 125 with a thickness between about 150 Å to 3000 Å is formed on the sidewalls 110A, 120A, bottoms 110B, 120B of the first and second trench 110, 120, and the mesa surface 115A. Alternatively, the gate oxide layer 125 can be formed by high temperature deposition to form HTO (high temperature oxide deposition) layer.

Subsequently, a first conductive layer 140 is formed by CVD on the gate oxide 125 and refilled the first trench 110 and the second trench 120, and at least with a height higher than the mesa 115. The first conductive layer 140 is also formed on the backside of the semiconductor substrate 100E due to the CVD process. The first conductive layer is material selected from the group consisting of metal, polysilicon and amorphous silicon. Preferably, the first conductive layer 140 is about 0.5 to 3.0 μm. For preventing inner portion of first trench from forming voids therein, the polysilicon layer formed by LPCVD (low pressure CVD) which has good step coverage is preferred as the material of the first layer 140. However if the aspect ratio of first trench 110 over 5, amorphous silicon by PECVD would be preferred. The amorphous silicon has better gap filled characteristic than polysilicon. Surely, to make it with conductive properties, an amorphous silicon recrystallized process is needed.

Figure 4:
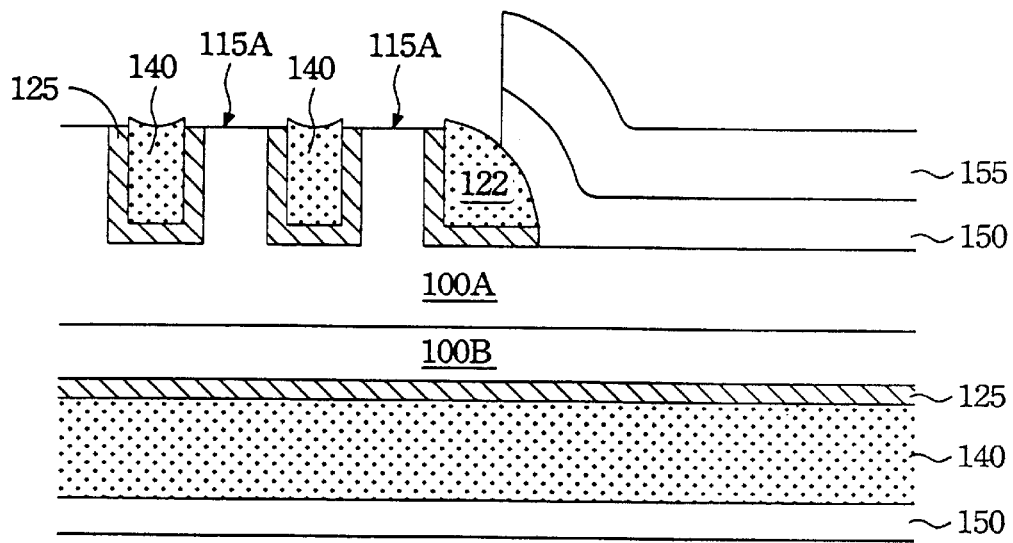
FIG. 4 is a cross-sectional view of defining termination structure oxide layer to expose active region and a portion of spacer-like MOS gate in accordance with the present invention.

Please refer to FIG. 4, an anisotropic etching is done to remove the excess first conductive layer 140 above the mesa surface 11 SA using the gate oxide layer 125 on the mesa 115 as an etching stop layer. After this process, a spacer-like MOS gate 122 having a width (along cross-sectional view) about the same as the height of the second trench is formed on the sidewall 125A of the second trench 120.

Thereafter, a dielectric layer 150 for termination structure is formed. The dielectric layer is a TEOS layer either LPTEOS or PETEOS or $O_3$-TEOS or HTO layer. The dielectric layer 150 is between about 0.2–1.0 μm.

Next, a photoresist pattern 155 is coated on the dielectric layer 150 so as to define ranges of Schottky contacts. And then a dry etching using photoresist pattern 155 as a mask is carried out to expose mesa surface 115A and first conductive layer 140 of the first trench 110.

Turning to FIG. 5 after stripping the photoresist pattern 155, a backside unwanted layer removal is implemented to expose surface of the base substrate 100B. The unwanted layers are those layers formed on the backside of semiconductor substrate due to thermal oxidation process or CVD process for fabricating devices in the active region, including dielectric layer 150, first conductive layer 140, and gate oxide layer 125.

Thereafter, a sputtering process is performed to deposit second conductive layer so as to form Schottky contact regions 115 between second conductive layer and the first substrate 100A and to form cathode 160, which is an ohmic contact between second conductive layer and the second substrate 100B. Finally, a photoresist pattern 165 is formed on the second conductive layer to define anode electrode 160A. In a preferred embodiment, the anode 160A is formed from active region extending to the second trench 120 and at least to a region away from the active region by 2.0 μm. So the bending region of the depletion region is able to be far away from the active region.

Figure 5A:
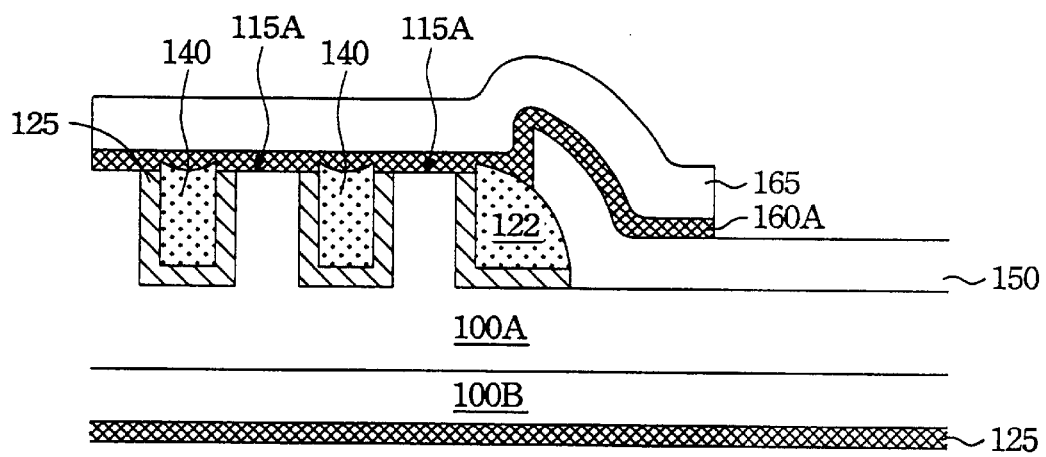
FIG. 5A is a cross-sectional view of forming anode electrode and cathode electrode on both side of the semiconductor substrate so that Schottky diode and the termination structure are finished in accordance with the present invention.
Figure 5B:
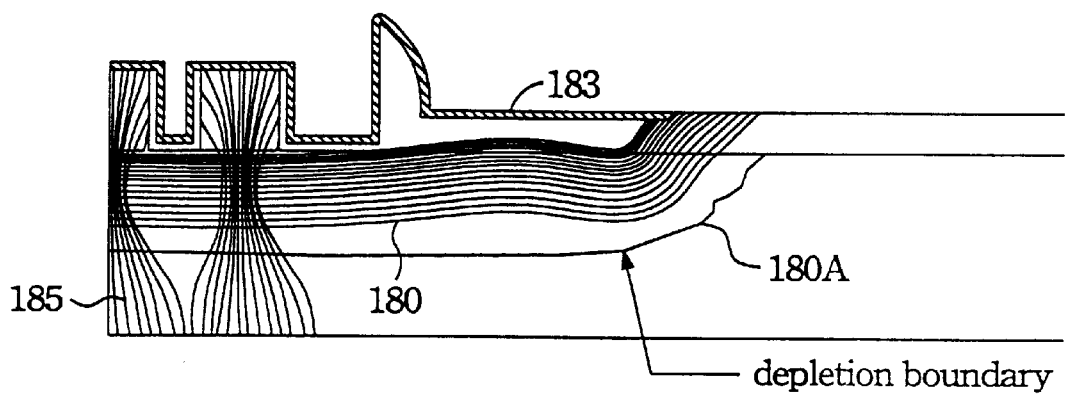
FIG. 5B shows simulation results of equipotential lines and lines of electric force by using Schottky diode and the termination structure of the present invention.

FIG. 5B shows one of the electric properties of the trench MOS termination structure (shown in FIG. 5A). To simulate the reverse bias, for example, Schottky diode is exerted by a reverse bias. Hence, the cathode 160 has, for example, 100 Volt and anode 183 has 0 Volt. The numeral 180 denotes equipotential lines. In the figure, the voltages burdened by the equipotential lines from bottom to up are gradually decreased. The lines perpendicular to the equipotential lines 180 represent lines of electrical force. As shown in the figure, leakage current only generates in the active region and almost none in the depletion region under termination region. Moreover, the boundary of depletion region, denoted by label 180A, gives flat characteristic, and thus the voltage breakdown premature would not occur. It gives only a little bit of leakage current.

Figure 5C:
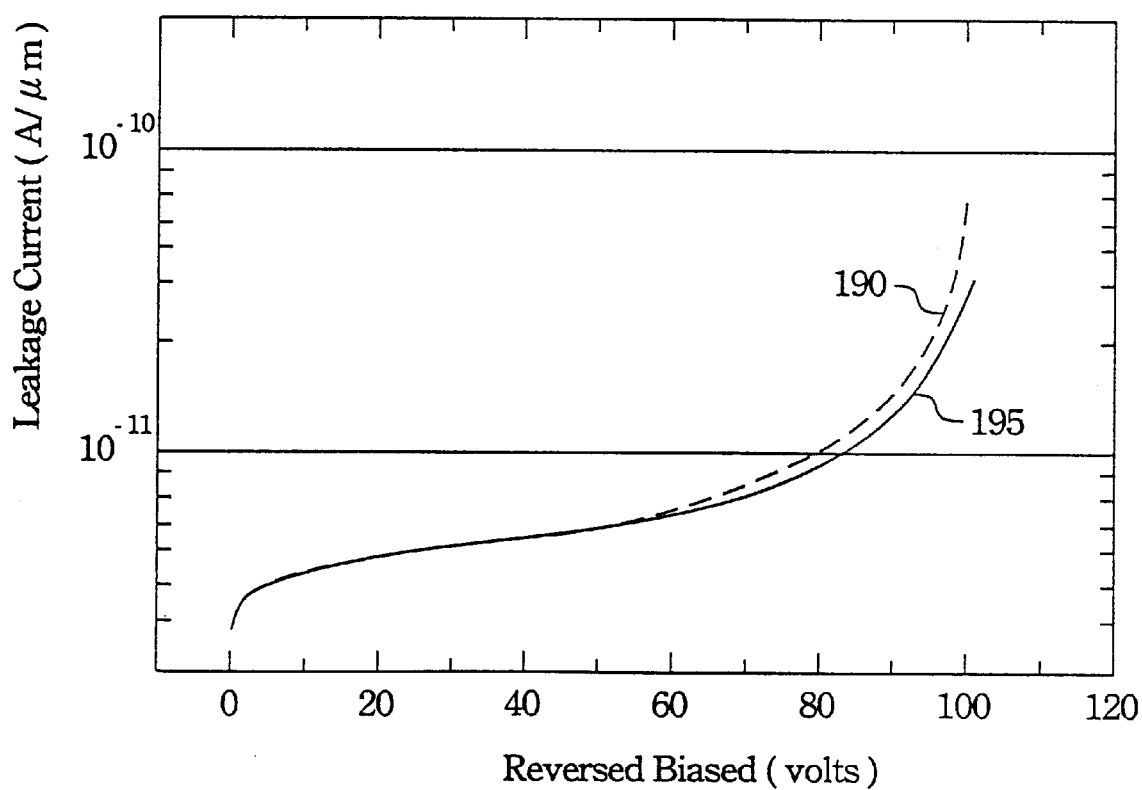
FIG. 5C shows simulation results of leakage current of trench Schottky diode with and without the termination structure of the present invention.

FIG. 5C shows a comparison for reversed current curves of the trench MOS structure without termination structure 195 and with the termination structure 190 in accordance with the present invention. The termination structure merely increases reversed current by 8.8%. By contrast to 12.8% occurs in the conventional termination structure, the LOCOS combines with guard ring structure. The present invention gives significant improvement. In addition, it requires at least 4 photo masks by conventional manufacture processes compared to three masks only in the present invention (e.g., forming trench ($1^{st}$), contact definition ($2^{nd}$), and the second conductive layer etching to form anode ($3^{rd}$)). The present invention gives a simpler process.

The second preferred embodiment using the termination structure according to the present invention is to form trench DMOS structure and termination structure.

Figure 6:
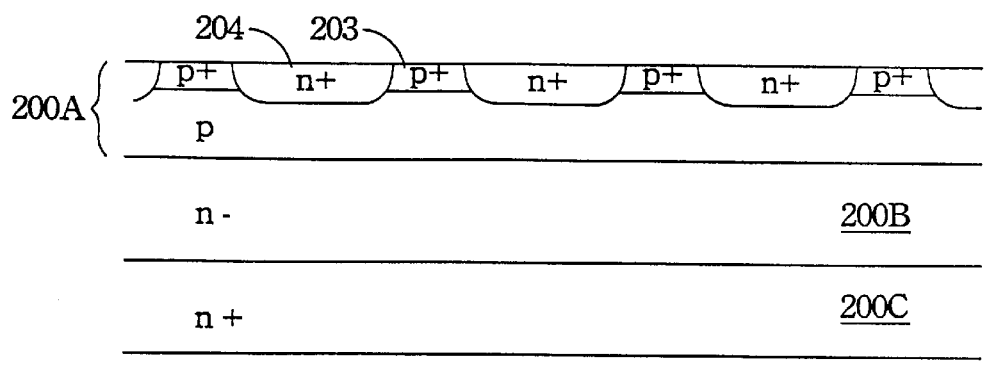
FIG. 6 is a cross-sectional view of semiconductor substrate prepared for DMOS device and termination structure in accordance with the present invention.

Referring to FIG. 6, for DMOS structure, the semiconductor substrate prepared is different from the case of forming Schottky diode but processes are quite similar. To forming DMOS and termination structure simultaneously, firstly, a semiconductor substrate 200 from the top to the bottom comprises a first layer 200A, a second layer 200B and a base substrate 200C. The first layer 200A and the second layer are formed on the base substrate 200C by epitaxial processes.

The first layer 200A having a p-type conductive doped impurities as a base layer and then a doping layer 203 with p-type conductive heavily doped impurities on the top portion of the first layer 200A. The second layer 200B is with n-type conductive doped impurities, and the third layer 200C with n-type conductive heavily doped impurities. Furthermore, a plurality of n+ regions are formed in the upper portion of the first layer 200A to cut p+ layer 203 to be as many n+ regions 204 and p+ region 204 by ion implantation, as is shown in FIG. 6. The thickness of the first and second layer 200A and 200B are 0.5 μm–5.0 μm and 3 μm–30 μm, respectively.

Figure 7:
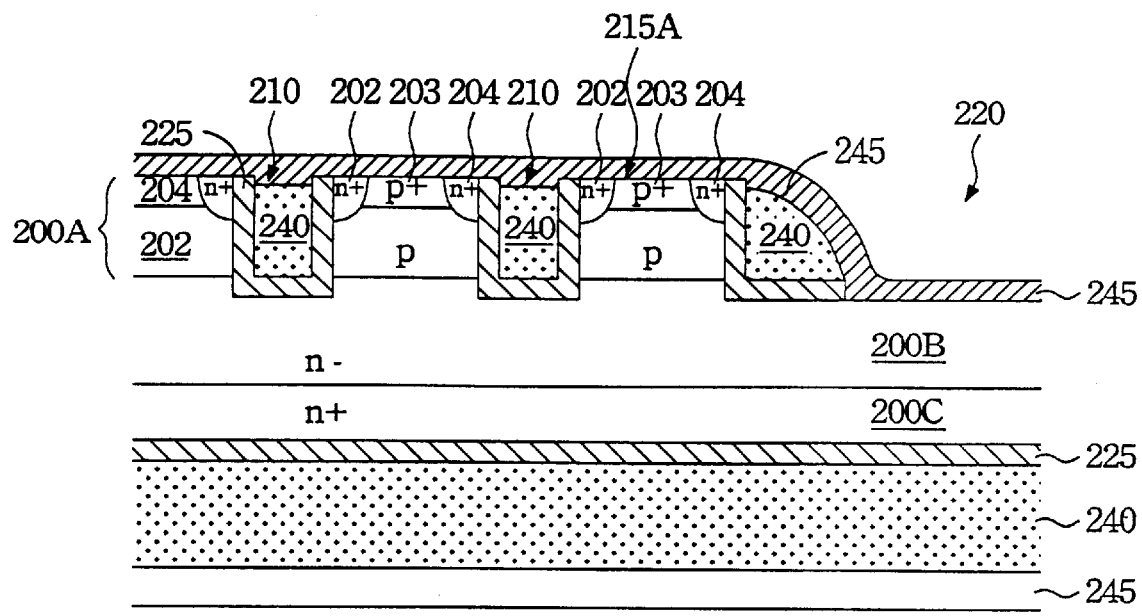
FIG. 7 is a cross-sectional view of etching back first conductive layer and then performing a high temperature thermal oxidation process to form inter-conductive oxide layer in accordance with the present invention.

Thereafter, please refer to FIG. 7, as forging method described in the first preferred embodiment, a plurality of the first trenches 210 and the second trench 220 having a mesa 215 in between are formed firstly. The first trenches 210 are formed in the active region, through n+ regions 204. and the second trench 220 is formed in the region from the boundary of the active region to an edge of the semiconductor substrate 200 (or a die).

Next, a high temperature oxidation process is performed to form a gate oxide layer 225 with a thickness of between about 150 Å to 3000 Å. Then, a conductive layer 240 selected from first polysilicon or amorphous silicon is refilled to the first trenches 210 and the second trench 220 and over mesa 215. An etching back step is then carried out to remove excess conductive layer 240 using gate oxide layer 225 on the surface of mesa 215A as a stopping layer. The gate oxide layer 225 removal above mesa is then followed using the n+ region 204 and the p+ region 203 as a stopping layer.

Subsequently, another thermal oxidation process is performed to form an inter-conductive oxide layer 245 by oxidizing a portion of the first conductive layer 240. Since the grain boundaries of the polysilicon can provide oxygen fast diffusion paths, the oxide layer formed by the polysilicon or amorphous silicon in the first trenches 210 and the second trench 220 are much thicker than that on the semiconductor substrate, the mesa surface 215A.

Figure 8:
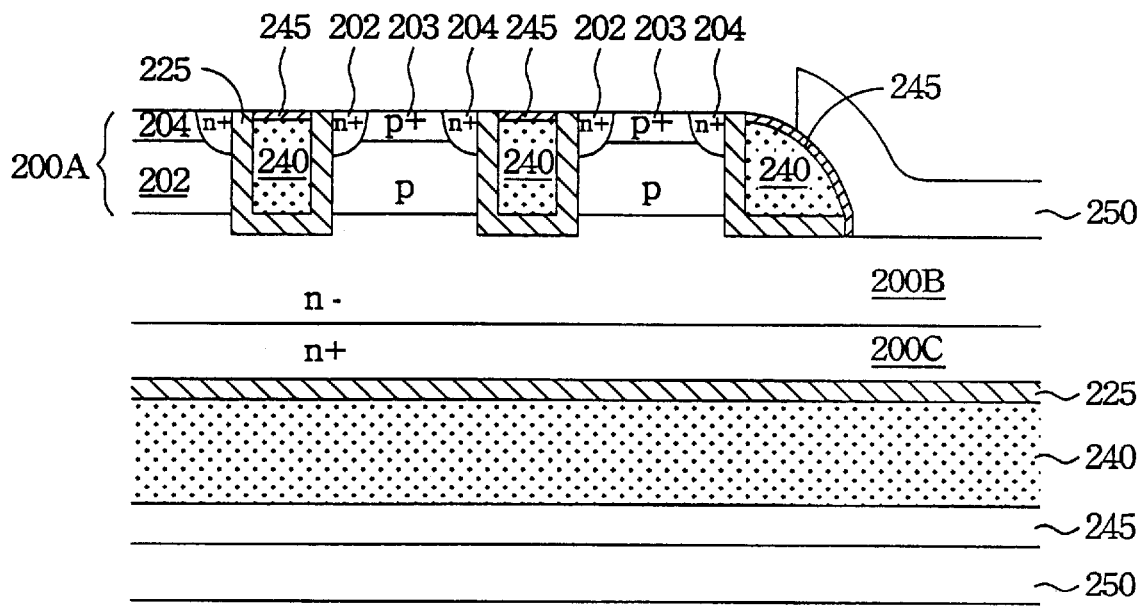
FIG. 8 is a cross-sectional view of defining termination structure oxide layer to expose active region and a portion of spacer-like MOS gate in accordance with the present invention.

Referring to FIG. 8 an etching back step is performed to remove thermal oxide layer 245 above surface of the first layer 200A, the n+ region 204 and p+ region 203. Worth to note, there is still a thermal oxide layer 245 on the spacer 240 of the second trench 220 and on the top surface of first conductive layer 240 after this step to provide isolation function. A TEOS oxide layer 250 is then formed on all areas. A photoresist pattern is then formed on TEOS oxide layer 250 of the first layer 200A to define source contact regions.

Figure 9:
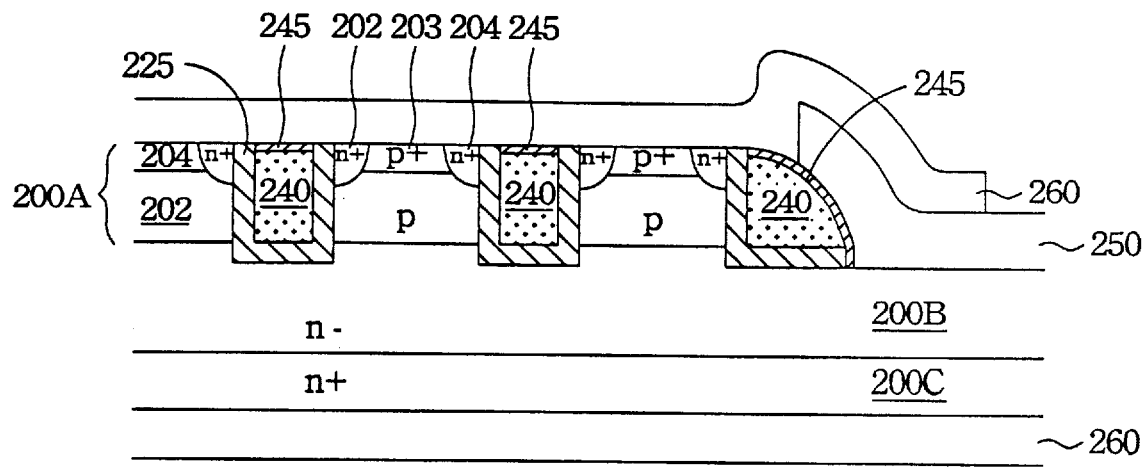
FIG. 9 is a cross-sectional view of forming source electrode and drain electrode on both side of the semiconductor substrate so that DMOS device and the termination structure are finished in accordance with the present invention.

Referring to FIG. 9, before performing a sputtering process, the unwanted layers formed on the backside of semiconductor substrate (or say base substrate 200C) are removed firstly. The unwanted layers includes TEOS oxide layer 250, inter-conductive oxide layer 245, first conductive layer 240 and gate oxide layer 225 on the surface of base substrate 200C, which are formed simultaneously while making the devices in the active region.

Subsequently, a metal layer 260 deposition by sputtering is performed to form source contact on the first layer 200A and drain contact on the base substrate 200C i.e. the backside of the semiconductor substrate. As before, the metal layer 260 formed on the active region is still required to extend to the termination structure 220 by a distance at least about 2.0 μm so as to distant from the active region. To do this, a lithographic and an etching process are successively carried out as before.

The third preferred embodiment using the termination structure according to the present invention is to form trench IGBT structure and termination structure simultaneously.

Figure 10:
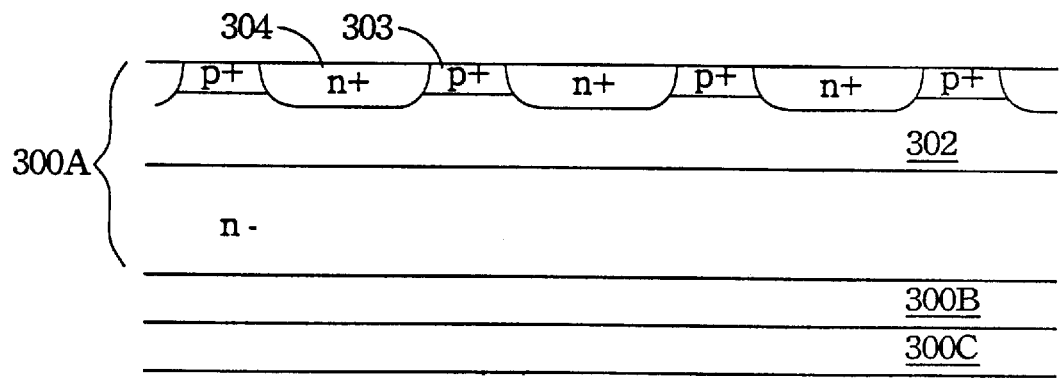
FIG. 10 is a cross-sectional view of semiconductor substrate prepared for IGBT and termination structure in accordance with the present invention.

Referring to FIG. 10, for the trench MOS to be as the IGBT structure, the semiconductor substrate prepared is different from the case of forming Schottky diode but very similar to the semiconductor substrate using for trench DMOS device. In addition, the process is almost the same as the processes of fabricating trench DMOS. To forming IGBT and termination structure simultaneously, firstly, a semiconductor substrate 300 prepared from the top to the bottom comprises a first layer 300A, a second layer 300B, a third layer 300C and a base substrate 300D. The first layer 300A, the second layer 300B, and third layers 300C, are formed on the base substrate 300D by epitaxial processes.

The first layer 300A, 300B and 300C having doping type, and doping concentration similar to the semiconductor substrate shown in FIG. 6. For example, first layer 300A is p-type base layer having upper portion n+ regions 304 and p+ regions 303 in the upper portion of the p-base layer 302. The second layer 300B is a n– doping layer as a drift region and third layer 300C is a n+ layer 300B as a buffer layer. The base substrate 300D is, however, a p-type conductive impurities heavily doped region. The thickness of the first and the second layer 300A and 300B are 0.5 μm–10.0 μm and 3 μm–100 μm, respectively.

Figure 11:
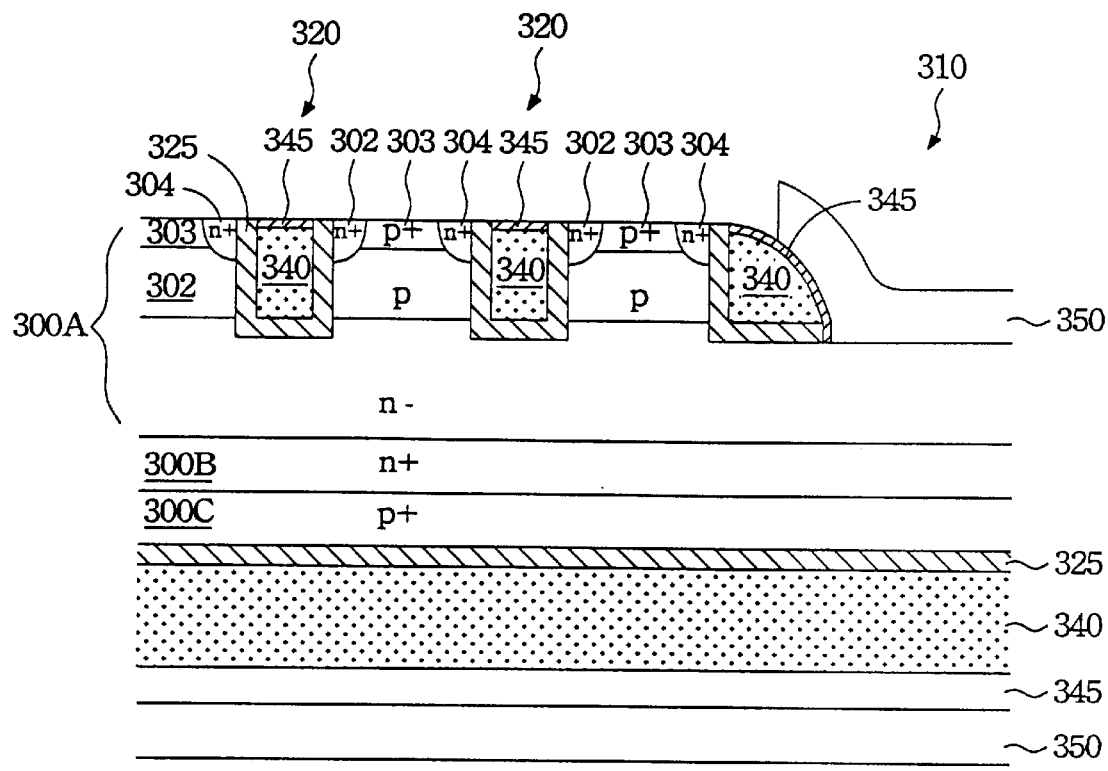
FIG. 11 is a cross-sectional view of defining termination structure oxide layer to expose active region and a portion of spacer-like MOS gate in accordance with the present invention.

Turning to FIG. 11, a plurality of the first trenches 310 are formed through the n+-doped region 304. The bottom of the first trenches 310 comes down to below the layer of the p-type-doped layer 302. Furthermore, the second trench 320 and first trench individual, each is spaced by a mesa 315 having 0.2 to 4.0 μm. The second trench 320 is formed at the boundary of the active region and is extended to an edge of the semiconductor substrate.

After an thermal oxidation process to form a gate oxide layer with a thickness of between 150 Å to 3000 Å, a refilled process with the first conductive material 340 such as polysilicon or amorphous silicon layer is deposited on the first trenches 310 and the second trench 320. An etch back process is then performed using gate oxide layer 325 on the surface of the mesa 315 as a stopping layer so that only the first trenches 310 and spacer-like MOS gate in the second trench have the first conductive material 340.

As the second embodiment depicted before, gate oxide layer 325 on the surface of the first layer is then removed and then another thermal oxidation process is carried out to form inter-conductive oxide layer 345 for the conductive layer 340 and the metal layer (formed later) isolation. Thereafter, the thermal oxide 345 above mesa surface 315A is removed but a portion of the thermal oxide layer, which is on the first conductive layer in the first trenches 310 and the second trench 320 are remaining as an inter-conductive oxide layer.

Still referring to FIG. 11, a TEOS dielectric layer 350 deposition on all areas and photoresist pattern coating are followed successively as before. Thereafter, an etching process is implemented to expose the n+-doped region 204 and the p+-doped region.

Figure 12:
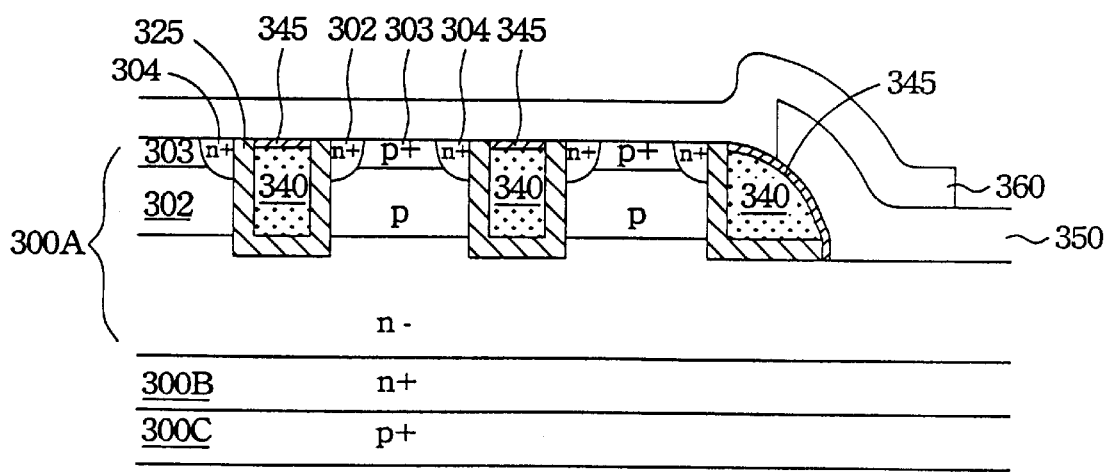
FIG. 12 is a cross-sectional view of forming emitter electrode and collector electrode on both side of the semiconductor substrate so that IGBT and the termination structure are finished in accordance with the present invention.

FIG. 12 shows backside unwanted layers on base substrate are removed before metal sputtering. After the second conductive layer, generally, a metal layer is formed on a surface of base substrate 300D to form collector electrode. After successively lithographic and etching process, the emitter electrode is formed on the surface of 300A, which contacts the p+ region 303 and n+ region 304. One end of emitter electrode is located at a distance away from active region.

The benefits of this invention are:
(1) The depletion boundary is flat and the bending region of depletion boundary is far away from active region. Both the properties are able to prevent voltage breakdown phenomena from occurring prematurely.
(2) The leakage current generated by the invention termination structure during reversed-biased is small than that of conventional LOCOS plus guard ring termination structures (8.8% vs. 12.8%).
(3) The method for fabricating the trench MOS device with termination structure is simpler than that of conventional methods. The invention termination structure requires less photo masks.

As is understood by a person skilled in the art, the foregoing preferred embodiment of the present o invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A termination structure for trench MOS devices, said termination structure comprising:

a semiconductor substrate having a plurality of trench MOS devices spaced from each other formed in an active region of said semiconductor substrate;

a trench termination formed from a boundary of said active region extended to an edge of said semiconductor substrate;

a MOS gate formed on a sidewall adjacent said boundary;

a termination structure oxide layer formed on said trench termination having a covering range from a portion of said MOS gate extended to said edge;

a first electrode formed on a backside surface of said semiconductor substrate; and a second electrode formed atop said active region, an exposed portion of said MOS gate, and extended to cover a portion of said termination structure oxide layer.

2. The termination structure of claim 1, wherein said trench termination has a depth of between about 0.4–10 μm.

3. The termination structure of claim 1, wherein said MOS gate comprises a conductive layer and a gate oxide layer formed therebetween said trench termination and said conductive layer.

4. The termination structure of claim 1, wherein said trench MOS devices comprises power transistors.

5. The termination structure of claim 4, wherein said power transistors are devices selected from the group consisting of Schottky diodes, DMOSs, and IGBTs.

6. A termination structure for trench MOS devices, said termination structure and said trench MOS devices comprising:

a semiconductor substrate having a plurality of first trenches formed in an active region and a second trench formed adjacent said first trenches, said second trench being a trench termination;

a plurality of first MOS gates, respectively, formed in said first trenches, and a second MOS gate formed on a sidewall of said second trench;

a termination structure oxide layer formed in said second trench to cover a portion of said second MOS gate and to cover a bottom of said second trench; and a first electrode formed on a backside surface of said semiconductor substrate; and a second electrode formed atop said active region, an exposed portion of said MOS gate, and extended to cover a portion of said termination structure oxide layer.

7. The termination structure and trench MOS devices of claim 6, wherein said semiconductor substrate comprises a first layer and a base substrate, and said first layer has a first kind of conductive impurities lightly doped and said base substrate has said first kind of conductive impurities heavily doped, and thus said semiconductor substrate is for Schottky diode.

8. The termination structure and trench MOS devices of claim 7, wherein said first trenches and second trench are formed in said first layer having a depth of between about 0.4–10 μm.

9. The termination structure and trench MOS devices of claim 6, wherein said second trench is formed from a boundary of said active region to an edge of said semiconductor substrate, so that said second trench has one sidewall only.

10. The termination structure and trench MOS devices of claim 6, wherein gate material of said first gates and said second gate is selected from the group consisting of metal, polysilicon, and amorphous silicon.

11. The termination structure and trench MOS devices of claim 6, wherein said second electrode is to make a bending region of a depletion region distant from said boundary of said active region by at least 2 μm in distance.

12. The termination structure and trench MOS devices of claim 6, wherein said trench MOS devices are DMOS devices or IGBT devices.

13. A termination structure for trench MOS devices, said termination structure and trench MOS devices comprising:

a semiconductor substrate having a plurality of trench MOS devices spaced from each other formed in an active region of said semiconductor substrate;

a trench termination formed from a boundary of said active region extended to an edge of said semiconductor substrate;

a MOS gate formed on a sidewall adjacent said boundary;

a termination structure oxide layer formed on said trench termination having a covering range from a portion of said MOS gate extended to said edge; and a conductive layer formed on a backside surface of said semiconductor substrate as a first electrode, and formed atop said active region, an exposed portion of said MOS gate and extended to cover a portion of said termination structure oxide layer, as a second electrode, so that a bending portion of said depletion region is distant from said boundary of said active region by at least 2 μm.

14. The termination structure and trench MOS devices of claim 13, wherein said semiconductor substrate comprises a first layer and a base substrate, and said first layer has a first kind of conductive impurities lightly doped and said base substrate has said first kind of conductive impurities heavily doped, and further said semiconductor substrate is for Schottky diode.

15. The termination structure and trench MOS devices of claim 13, wherein said trench termination has a depth of between about 0.4–10 μm.

16. The termination structure and trench MOS devices of claim 13, wherein said trench MOS devices and said MOS gate have a gate material selected from the group consisting of metal, polysilicon and amorphous silicon.

17. The termination structure and trench MOS devices of claim 13, wherein said trench MOS devices are power devices selected from the group consisting of Schottky diode, DMOS devices and IGBT devices.

* * * * *